(12) United States Patent
Stojakovic et al.

(10) Patent No.: US 6,815,364 B2
(45) Date of Patent: Nov. 9, 2004

(54) TUNGSTEN HARD MASK

(75) Inventors: George Stojakovic, Hopewell Junction, NY (US); Matthias Lipinski, Wappingers Falls, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 88 days.

(21) Appl. No.: 09/967,795

(22) Filed: Sep. 28, 2001

(65) Prior Publication Data

US 2003/0064602 A1 Apr. 3, 2003

(51) Int. Cl.$^7$ .............................................. H01L 21/302
(52) U.S. Cl. ...................... 438/710; 438/714; 438/717; 438/720; 438/725; 438/742
(58) Field of Search ................................. 438/710, 714, 438/717, 720, 725, 742

(56) References Cited

U.S. PATENT DOCUMENTS 6,087,269 A * 7/2000 Williams .................... 438/735
6,146,542 A * 11/2000 Ha et al. ........................ 216/2
6,444,513 B1 * 9/2002 Besser et al. ............... 438/216
6,548,415 B2 * 4/2003 Ting et al. .................. 438/706

* cited by examiner

*Primary Examiner*—Robert Kunemund
*Assistant Examiner*—Binh X. Tran

(57) ABSTRACT

Disclosed is a method of tungsten-based hard mask etching of a wafer, comprising providing a patterned tungsten-based hard mask atop a metal-based surface of said wafer, etching through said pattern with a plasma etch that is selective for said metal-based surface with respect to tungsten, and executing a flash etch selective for tungsten, said etch of at least a minimum duration effective in removing substantially all defects caused by tungsten particulate contaminating said wafer. In another aspect of the first embodiment, said tungsten-based hard mask comprises a material selected from tungsten or an alloy thereof. In another aspect of the first embodiment, said metal based surface comprises a material selected from aluminum or an alloy thereof.

21 Claims, 3 Drawing Sheets

TUNGSTEN HARD MASK

FIELD OF THE INVENTION

This invention relates to the fabrication of interconnect layers using tungsten hard masks.

BACKGROUND OF THE INVENTION

U.S. Pat. No. 6,087,269, issued Jul. 11, 2000, for a METHOD OF MAKING AN INTERCONNECT USING A TUNGSTEN HARD MASK discloses the fabrication of an interconnect layer using a tungsten hard mask by forming a tungsten-based layer over an aluminum-based layer. A polymer layer is deposited over the tungsten-based layer and patterned. The tungsten-based layer is patterned by applying a fluorine-based etchant using the polymer layer as an etch mask. Then the aluminum-based layer is patterned by applying a chlorine-based etchant using the tungsten-based layer as an etch mask.

Tungsten, however, doesn't give off volatile compounds under the condition of a chlorine-based aluminum etch process. This means that tungsten-containing particles, pure tungsten as well as tungsten chlorides, are partially sputtering onto the wafer. This leads to shorts between different aluminum features and eventually to low electrical yields. The above-mentioned US patent gives no measures how to solve or avoid this problem.

SUMMARY OF THE INVENTION

Disclosed is a method of tungsten-based hard mask etching of a wafer, comprising providing a patterned tungsten-based hard mask atop a metal-based surface of said wafer, etching through said pattern with a plasma etch that is selective for said metal-based surface with respect to tungsten, and executing a flash etch selective for tungsten, said etch of at least a minimum duration effective in removing substantially all defects caused by tungsten particulate contaminating said wafer.

In another aspect of the first embodiment, said tungsten-based hard mask comprises a material selected from tungsten or an alloy thereof.

In another aspect of the first embodiment, said metal based surface comprises a material selected from aluminum or an alloy thereof.

In another aspect of the first embodiment, said plasma etch is a chlorine-based plasma etch.

In another aspect of the first embodiment, said chlorine-based plasma etch is executed using a plasma comprising a gas selected from boron trichloride, chorine, or mixtures thereof.

In another aspect of the first embodiment, said flash etch is a fluorine-based etch.

In another aspect of the first embodiment, said fluorine-based etch is a sulfur hexafluoride plasma etch.

In another aspect of the first embodiment, said fluorine-based etch is executed for a duration of from about 3 to about 5 seconds.

In another aspect of the first embodiment, said flash etch is executed for no more than 10 seconds.

In another aspect of the first embodiment, said flash etch is executed for a duration of from about 3 to about 5 seconds.

Disclosed is a second embodiment of a method of tungsten-based hard m ask etching of a wafer, comprising providing a patterned tungsten-based hard mask atop a metal-based surface of said wafer, etching through said pattern with a plasma etch comprising an effective amount of a first etchant that is selective for said metal-based surface with respect to tungsten and a lesser amount of a tungsten etchant, and executing a flash etch selective for tungsten, said etch of at least a minimum duration effective in removing substantially all defects caused by tungsten particulate contaminating said wafer.

In another aspect of the second embodiment, said tungsten-based hard mask comprises a material selected from tungsten or an alloy thereof.

In another aspect of the second embodiment, said metal based surface comprises a material selected from aluminum or an alloy thereof.

In another aspect of the second embodiment, said first etchant comprises a gas selected from boron trichloride, chorine, or mixtures thereof.

In another aspect of the second embodiment, said tungsten etchant is a fluorine-based etchant.

In another aspect of the second embodiment, said plasma etch is a chlorine-based etch comprising a lesser amount of fluorine-based etchant.

In another aspect of the second embodiment, said flash etch is a fluorine-based etch.

In another aspect of the second embodiment, said fluorine-based etch is a sulfur hexafluoride plasma etch.

In another aspect of the second embodiment, said fluorine-based etch is executed for a duration of from about 3 to about 5 seconds.

In another aspect of the second embodiment, said flash etch is executed for no more than 10 seconds.

DETAILED DESCRIPTION OF PREFERRED EMBODIMENTS

Disclosed is a method of reducing tungsten sputter during the fabrication of interconnects on a semiconductor surface. Typically, an interconnect layer may be fabricated using a tungsten hard mask by forming a tungsten-based layer over an aluminum-based layer. A polymer layer is then deposited over the tungsten-based layer and patterned. The tungsten-based layer is then identically patterned by applying a fluorine-based etchant using the polymer layer as an etch mask. Then the aluminum-based layer is patterned by applying a chlorine-based etchant using the tungsten-based layer as an etch mask. Such a method is disclosed in Williams, J., U.S. Pat. No. 6,087,269, METHOD OF MAKING AN INTERCONNECT USING A TUNGSTEN HARD MASK, issued Jul. 11, 2000, the disclosures of which are incorporated by reference herein in their entirety.

Figure 1:
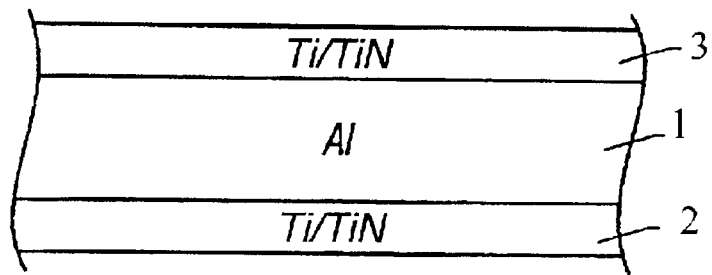
FIG. 1 shows a cross section of a typical starting structure of a semiconductor wafer.

Referring to FIGS. 1 through 6, there is shown the prior art method of making an interconnect with a tungsten hard mask. FIG. 1 shows a cross section of a typical starting structure comprising a an metal-based layer 1, usually aluminum-based, upon a substrate 2. The substrate will typically be titanium-based. An optional adhesion layer 3 may be provided upon the metal-based layer 1. The adhesion layer, if used, 3 will typically be of titanium Ti, titanium nitride TiN, or both., but the tungsten layer may be deposited directly upon the conductive layer if desired, though this is generally not preferred because of the reduced adhesion. The aluminum-based material may be aluminum or an aluminum alloy doped with other materials, such as copper, and may be deposited upon the substrate layer by sputtering or evaporation.

Aluminum may be deposited in an LPCVD reactor by the pyrolysis of tri-isobutyl aluminum [Al($C_4H_9$)$_3$], trimethyl aluminum [Al$_2$(CH$_3$)$_6$], dimethyl aluminum hydride [AlH:(CH$_3$)$_2$], or dimethylamine alane [AlH$_3$:NC$_2$H$_5$(CH$_3$)$_2$]. The latter three precursors posses aluminum-hydrogen bonds that are easily dissociated at temperatures below 200 C. to leave aluminum films of high purity. Reaction pressures are typically at 100 to 200 Torr. A disadvantage of aluminum is that it exhibits poor electromigration resistance. A way around this problem, if desired, is to first lay down an aluminum film by CVD followed by a physical vapor deposition (PVD) of an aluminum-copper alloy of comparable thickness. Alternatively, the metal-based layer 1 may be deposited by sputter deposition.

Figure 2:
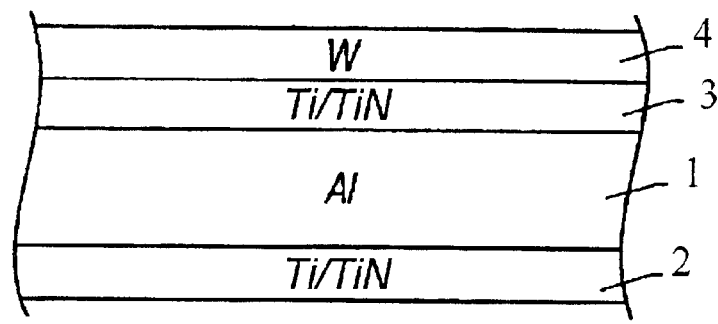
FIG. 2 shows the semiconductor wafer after deposition of a tungsten layer.

Referring to FIG. 2, a tungsten-based layer 4 is deposited upon the adhesion layer 3. Tungsten and tungsten alloys are typically deposited by sputter deposition, but may also be deposited by a blanket chemical vapor deposition (CVD) in a conformal layer over the wafer. CVD tungsten and alloys thereof bind poorly to silicon nitrides and silicon oxides, bind moderately to aluminum, but bind reasonably well to titanium (Ti), titanium-tungsten alloy (Ti:W), titanium nitride (TiN), and tungsten suicides (WSi$_x$, e.g., WSi$_2$), with TiN being the most widely used. Presently, deposition of a Ti film acting as a contact layer followed by deposition of a TiN film acting as an adhesion barrier layer is in wide use.

A typical procedure would be to first clean the wafer, preferably by an argon (Ar) sputter clean or other in situ process. Next, a thin layer (e.g., 5–50 nm) of Ti may optionally be deposited down as a contact layer for lowering contact resistance. Next a layer of TiN is deposited as an adhesion layer, because W and its alloys bind very well to TiN.

Figure 3:
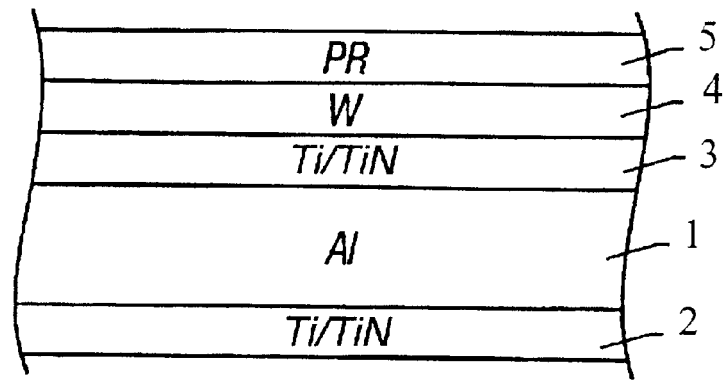
FIG. 3 shows the semiconductor wafer after deposition of a polymer layer.

Referring to FIG. 3, a polymer layer 5 is deposited upon the tungsten layer 4. The polymer layer will preferably comprise any suitable polymer plastic for which there exists a selective etch with respect to the underlying material (i.e., an etch that will etch the polymer, but not the surface it is deposited upon). Commonly available and economical protective polymers are those sold for anti-reflective coatings and photoresist layers in the lithographic arts, often referred to as "organic spin-on" polymers, which comprise polymer resins dissolved in solvent. Such resins will typically have molecular weights in the thousands or ten thousands as measured by gel permeation chromatography, but may even go into the millions. Novolak binder resins are commonly available and useful for use in the invention, such as are disclosed in Shiro et al., U.S. Pat. No. 5,674,657, POSITIVE-WORKING PHOTORESIST COMPOSITIONS COMPRISING AN ALKALI-SOLUBLE NOVOLAK RESIN MADE WITH FOUR PHENOLIC MONOMERS, the teachings of which are incorporated by reference herein in their entirety. A commonly used photoresist is sold under the designation "HPR-204" by Olin Hunt Specialty Products of New Jersey and comprises mixed meta- and para-cresol novolak binder resins and a napthaquinone-1,2-diazide-5-sulfonic acid triester of a trihydroxy benzophenone sensitizer dissolved in 85% by weight of ethyl cellusolve acetate, 8.6% by weight butyl acetate, and 5.2% by weight xylene, and 1.2% by weight ethyl benzene. Suitable antireflective coatings are co-polymers of benzophenone and bisphenol-A dissolved in an organic solvent, such as is described in Thomas et al., U.S. Pat. No. 6,207,787, ANTIREFLECTIVE COATING FOR MICROLITHOGRAPHY, the teachings of which are incorporated by reference herein in their entirety. Other suitable antireflective coatings include, but are certainly not limited to, organic solutions of multifunctional acrylates and methacrylate monomers, and polyurea and polysulfone polymers. Conformal antireflective coating suitable for use with the invention are also sold under the tradenames "DUV 30" and "DUV 32" by Brewer Science, Inc. of Rolla, Mo. Photoresists and antireflective coatings may also be thinned or diluted by mixing in additional solvent, such as is described in Daraktchiev, I. S., U.S. Pat. No. 4,996,080, PROCESS FOR COATING A PHOTORESIST COMPOSITION ONTO A SUBSTRATE, the teachings of which are incorporated by reference herein in their entirety. Commercially available planarizing antireflective coatings suitable for use with the invention include those sold under the product designations "DUV 30" and "DUV 32", by Brewer Science, Inc. of Rolla, Mo.

Conformal organic films are generally comprised of relatively high molecular weight resins, as high as 40,000 Daltons and above, dissolved in solvent, such as are described in Pavelick et al., U.S. Pat. No. 6,190,839, HIGH CONFORMALITY ANTIREFLECTIVE COATING COMPOSITIONS, the disclosures of which are incorporated by reference herein in their entirety. Commercially available conformal antireflective coatings suitable for use with the invention include those sold under the product designations "ARC 25", "DUV 44", and "DUV 42", also by Brewer Science, Inc. of Rolla, Mo., and those sold under the "AR" series trademark by Shipley Company, LLC of Marlborough, Mass., particularly those designated "AR5" and higher, such as "AR7" and "AR14". Also useful are other organic resists, such as that sold under the tradename KMER by Kodak Corporation, which is sold as a metal etch.

Of course, any polymer dissolved in a solvent that is sufficiently planarizing, adhering, and possessing the requisite selectivity will be suited to this invention. Photoresists and antireflective coatings are specifically cited for use with this invention because these materials are almost always readily at hand in any semiconductor fabrication facility.

Finally, it is also possible to lay down another Ti/TiN layer (not shown) upon the tungsten layer 4 prior to laying down the polymer layer 5. A film of Ti/TiN beneath a resist works as an anti-reflective coating.

Figure 4:
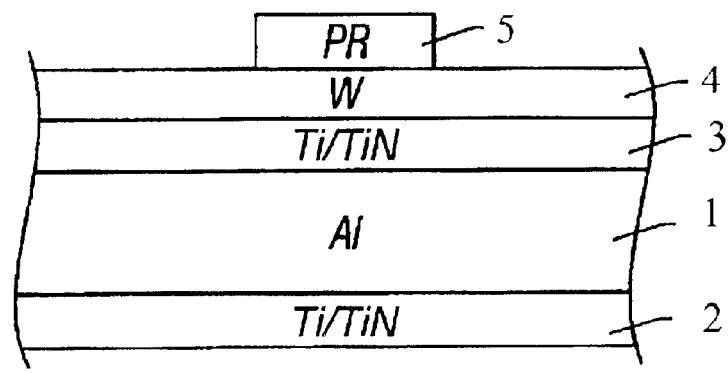
FIG. 4 shows the semiconductor wafer after patterning of the polymer layer.

Referring to FIG. 4, the polymer layer 5 is patterned using standard lithographic techniques.

Figure 5:
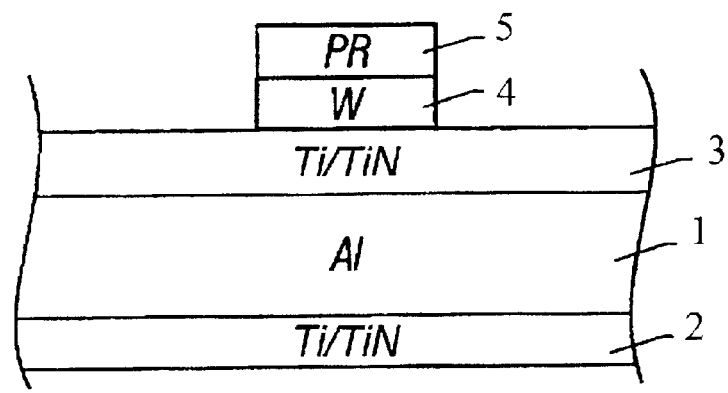
FIG. 5 shows the semiconductor wafer after etching the tungsten layer through the patterned polymer layer.

Referring to FIG. 5, the tungsten-based layer 4 is etched through the photoresist, preferably with an etch that is selective with respect to the metal-based layer 1, which will usually be aluminum-based. Fluorine-based etches are preferred, such as sulfur hexafluoride $SF_6$. The result is a tungsten-based mask. Commercially available RIE systems for use in the invention include Lam etchers and those sold under the "Etch Centura" tradename series by Applied Materials, among others. Such systems utilize a glow discharge and electrodes to combine the benefits of sputtering with those of enhanced plasma etching and to produce highly anisotropic etches.

Figure 6:
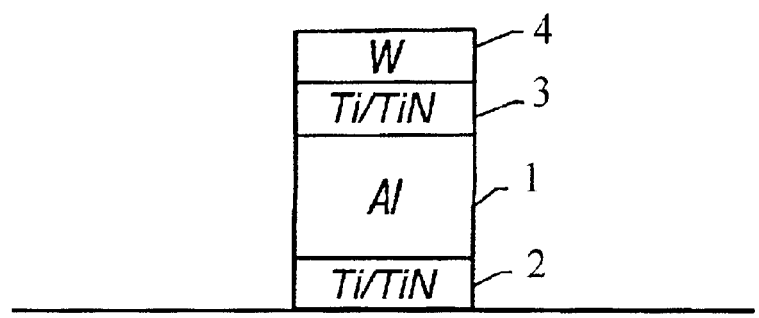
FIG. 6 shows the semiconductor wafer after etching the wafer using the tungsten layer as a hard mask.

Referring to FIG. 6, the metal-based layer 1 is etched through the tungsten hard mask 4 using an etch selective for the metal-based material and Ti/TiN (if this layer was used) with respect to tungsten. For aluminum and aluminum alloy metal-based layers 1, chlorine-based chemistry is preferred for this operation, such as boron trichloride ($BCl_3$) and chlorine gas ($Cl_2$) plasma reactive ion etches, usually diluted in an inert gas such as nitrogen ($N_2$) or argon (Ar). It is during this etch that sputtering of the tungsten occurs, resulting in tungsten particles deposited on the wafer, occasionally shorting out adjacent aluminum features. This etch will generally strip off the polymer layer 5.

Figure 7:
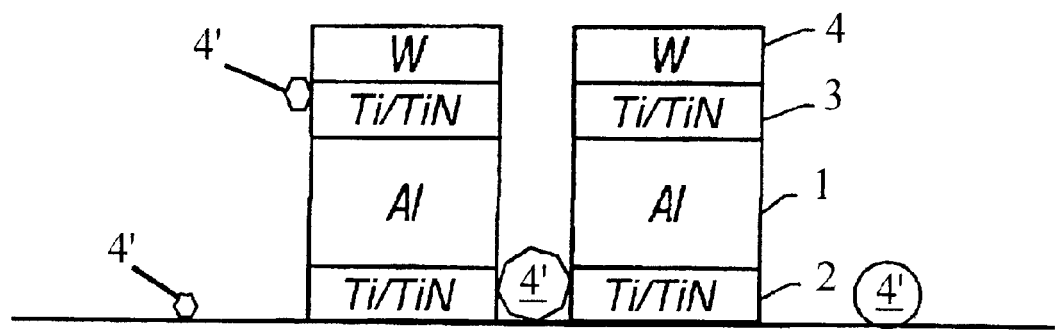
FIG. 7 shows a typical wafer after the etching operation of FIG. 6 contaminated by tungsten particles.

Referring to FIG. 7 there are shown tungsten particulate 4' on a sample structure. Note how a large enough particle can short out a pair of aluminum interconnects.

To eliminate the tungsten particulate, an additional etching step selective for tungsten is needed to remove it before further processing. In the first embodiment a tungsten selective etch is carried out, preferably a fluorine-based etch (e.g., $SF_6$, usually diluted in an inert gas such as nitrogen ($N_2$) or argon (Ar)), which may be under the same reaction conditions as that used to pattern the tungsten layer, but for a much briefer period of time so as to be effective in removing enough tungsten particulate to substantially reduce failure of the semiconductor circuitry, yet not so long a time as to undesirably etch the metal-based layer 1. What these exact times and conditions are will depend upon the structure of the metal-based layer 1 pattern and the amount of tungsten particulate. If the tungsten particulate contamination is light, then the etch may take no more than a matter of seconds, generally no more than 30 seconds, usually no more than 10 seconds, typically 3 to 5 seconds for most applications. This is the preferred method when the etch conditions are such that there is no heavy build up of tungsten, but still enough sputtered tungsten to cause electrical shorts. An advantage of this method is that the etch selectivity of tungsten in comparison to aluminum is not affected.

Figure 8:
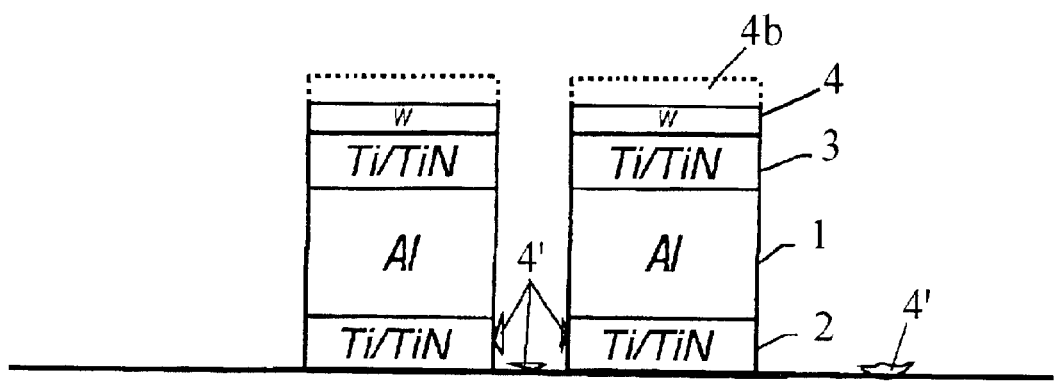
FIG. 8 shows a result of a wafer after a flash etch process.

The result of this flash etch is shown in FIG. 8, wherein enough of the tungsten particulate 4' is removed so as to eliminate the shorts, though some particulate 4' may be permitted to be left behind, lest a prolonged etch affect the profile of the aluminum structures. A portion 4b of the tungsten hard mask layer 4 is also removed unless this layer is first protected. One way to do this would have been to deposit a thicker layer of tungsten or to cover the tungsten with a layer of titanium and/or titanium nickel alloy. Often, however, the tungsten layer isn't required anyway and, in some cases, one may even want it removed.

It may be, however, that the tungsten contamination is excessive and the structure of the metal-based layer very fine. In such a case, the profile of the metal-based conductors would be undesirably affected by a flash etch of long enough duration to remove a sufficient amount of the tungsten. To solve this problem, in a second embodiment of the invention, a combined fluorine/chlorine chemistry is used for the aluminum etch (assuming the metal-based layer 1 is aluminum, which is to say that we are utilizing a combined tungsten-selective/metal-based-layer-material-selective chemistry). An aluminum etch step, for example, would not be carried out with a solely chlorine-based chemistry, but with a combined chlorine/fluorine based chemistry. A small percentage of a fluorine compound in the etchant makes sure that there is no excessive agglomeration of tungsten or tungsten chlorides that would thwart the flash etch because those agglomerates can permanently be transferred to volatile tungsten fluoride, which is pumped out of the chamber. Generally, about 10% fluorine in the gas mix will do.

This second embodiment of the invention is the preferred Method when the etch conditions are such that large amounts of tungsten contaminate are permanently redeposited onto the wafer.

Heavy tungsten build up is generally observed when the etch task requires higher bias power, lower pressure. Less tungsten is redeposited onto the wafer in cases with lower bias power, higher pressures.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of tungsten-based hard mask etching of a wafer, comprising:
   providing a patterned tungsten-based hard mask atop a metal-based surface of said wafer;
   etching through said pattern with a plasma etch comprising:
      an effective amount of a first etchant that is selective for said metal-based surface with respect to tungsten, and an effective amount of a second etchant that is selective for said tungsten with respect to said metal-based surface, wherein the amount of the first etchant is greater than the amount of the second etchant; and
   executing a flash etch selective for tungsten, said flash etch of at least a minimum duration effective in removing substantially all of the tungsten-based hard mask and tungsten particulate contaminating said wafer.

2. The method of claim 1 wherein said tungsten-based hard mask is a material selected from the group consisting of tungsten and an alloy thereof.

3. The method of claim 1 wherein said metal based surface is a material selected from the group consisting of aluminum and an alloy thereof.

4. The method of claim 1 wherein said first etchant is a gas selected from the group consisting of boron trichloride, chorine, and mixtures thereof.

5. The method of claim 1 wherein said flash etch is executed for no more than 10 seconds.

6. The method of claim 1 wherein the effective amount of the second etchant prevents the formation of excessive agglomeration of tungsten or tungsten chloride.

7. The method of claim 1 wherein the second etchant of the plasma etch is a fluorine-based etchant.

8. The method of claim 7 wherein the second etchant is a sulfur hexafluoride etch.

9. The method of claim 1 wherein said flash etch is a fluorine-based etch.

10. The method of claim 9 wherein said fluorine-based etch is a sulfur hexafluoride plasma etch.

11. The method of claim 10 wherein said fluorine-based etch is executed for a duration of from about 3 to about 5 seconds.

12. A method of tungsten-based hard mask etching of a wafer, comprising:

depositing and patterning a tungsten-based hard mask atop of an aluminum-based surface of a wafer;

etching through said pattern with a plasma etch comprising a mixture of fluorine-based etchant and a chlorine-based etchant, wherein an amount of the chlorine-based etchant is greater than an amount of the fluorine-based etchant; and executing a flash etch selective for tungsten, said flash etch of at least a minimum duration effective in removing substantially all tungsten particulate contaminating said wafer and remaining tungsten-based mask atop of the aluminum-based surface.

13. The method of claim 12 wherein said tungsten-based hard mask is a material selected from the group consisting of tungsten and an alloy thereof.

14. The method of claim 12 wherein said aluminum-based surface is selected from the group consisting of aluminum and an alloy thereof.

15. The method of claim 12 wherein said chlorine-based etchant is a gas selected from the group consisting of boron trichloride, chorine, and mixtures thereof.

16. The method of claim 12 wherein said flash etch is executed for no more than 10 seconds.

17. The method of claim 12 wherein the fluorine-based etchant is present in an amount effective in preventing the formation of excessive agglomeration of tungsten or tungsten chloride.

18. The method of claim 12 wherein said flash etch is a fluorine-based etch.

19. The method of claim 18 wherein said fluorine-based etch is a sulfur hexafluoride plasma etch.

20. The method of claim 19 wherein said fluorine-based etch is executed for a duration of from about 3 to about 5 seconds.

21. A method of tungsten-based hard mask etching of a wafer, comprising:

providing a patterned tungsten-based hard mask atop a metal-based surface of said wafer;

etching through said pattern to form metal-based interconnects with a plasma etch, the plasma etch comprises:

an effective amount of a first etchant that is selective for said metal-based surface with respect to tungsten, and an effective amount of a second etchant that is selective for said tungsten with respect to said metal-based surface, wherein the amount of the first etchant is greater than the amount of the second etchant; and executing a flash etch selective for tungsten, said flash etch of at least a minimum duration effective in removing tungsten particulate on the surface and disposed between the metal-based interconnects thereby preventing defects from forming between the metal-based interconnects.

* * * * *